(12) United States Patent
Shiobara et al.

(10) Patent No.: US 8,076,841 B2
(45) Date of Patent: Dec. 13, 2011

(54) ORGANIC ELECTROLUMINESCENT DISPLAY APPARATUS

(75) Inventors: Satoru Shiobara, Kawasaki (JP);
Toshifumi Mori, Tokyo (JP); Kenichi Ikari, Kawasaki (JP); Koichi Suzuki, Yokohama (JP); Akira Tsuboyama, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 285 days.

(21) Appl. No.: 12/573,346

(22) Filed: Oct. 5, 2009

(65) Prior Publication Data

US 2010/0090592 A1    Apr. 15, 2010

(30) Foreign Application Priority Data

Oct. 10, 2008    (JP) .................................. 2008-264427
Sep. 28, 2009    (JP) .................................. 2009-222633

(51) Int. Cl.
*H01L 51/50*    (2006.01)
*H01L 51/52*    (2006.01)

(52) U.S. Cl. ..................... 313/504; 313/503; 313/506
(58) Field of Classification Search .......... 313/500–512; 428/690
See application file for complete search history.

(56) References Cited

U.S. PATENT DOCUMENTS

| | | | |
|---|---|---|---|
| 6,274,979 B1 * | 8/2001 | Celii et al. ..................... | 313/506 |
| 6,905,788 B2 | 6/2005 | Tyan et al. ..................... | 428/690 |
| 7,129,632 B2 | 10/2006 | Park et al. ..................... | 313/503 |
| 7,632,714 B2 * | 12/2009 | Matsuda et al. ............... | 313/504 |
| 2003/0076032 A1 * | 4/2003 | Suzuri et al. ................... | 313/504 |
| 2007/0072001 A1 | 3/2007 | Tsuboyama et al. | |
| 2007/0148492 A1 | 6/2007 | Tsuboyama et al. | |
| 2008/0164809 A1 * | 7/2008 | Matsunami et al. .......... | 313/504 |

FOREIGN PATENT DOCUMENTS

| | | | |
|---|---|---|---|
| CN | 1407837 A | | 4/2003 |
| CN | 1849719 A | | 10/2006 |
| EP | 2175503 A2 * | | 4/2010 |
| JP | 2000323277 A * | | 11/2000 |
| JP | 2004137354 A * | | 5/2004 |
| JP | 2004-241374 | | 8/2004 |

OTHER PUBLICATIONS

Chinese Office Action issued in the counterpart application No. 200910178478.2, dated Apr. 19, 2011, along with its English-language translation—11 pages.

Tsuboyama et al., "Photophysical Properties of Highly Luminescent Copper(I) Halide Complexes Chelated with 1,2-Bis(diphenylphosphino)benzene", Inorganic Chemistry, vol. 46, No. 6, pp. 1992-2001 (2007).

* cited by examiner

*Primary Examiner* — Mariceli Santiago
(74) *Attorney, Agent, or Firm* — Fitzpatrick, Cella, Harper & Scinto

(57) ABSTRACT

An organic electroluminescent display apparatus having organic electroluminescent devices each of which is excellent in color reproducibility and has high emission efficiency in which green organic electroluminescent devices each have a delayed fluorescent material and a microcavity, and the hole transport layer of each of the devices has the same thickness as that of the hole transport layer of each of blue organic electroluminescent devices.

2 Claims, 2 Drawing Sheets

ORGANIC ELECTROLUMINESCENT DISPLAY APPARATUS

BACKGROUND OF THE INVENTION

1. Field of the Invention

The present invention relates to an organic electroluminescent (EL) display apparatus.

2. Description of the Related Art

The research and development of organic EL display apparatuses each using organic EL devices have been vigorously performed in recent years.

Each of the organic EL display apparatuses has multiple red organic EL devices, multiple green organic EL devices, and multiple blue organic EL devices, and the devices each independently act as a pixel to perform emission and non-emission. As a result, each of the apparatuses can display a full-color image.

Each of the organic EL devices has a pair of electrodes and an emission layer formed of an organic compound interposed between the electrodes. The emission layer has a fluorescent light emitting material or phosphorescent light emitting material as itself or as, for example, a guest material having a small weight ratio.

Each of the organic EL devices for the respective colors has been developed so as to be capable of being driven at a low voltage. At the time of the development, a layer constitution in each of the organic EL devices for the respective colors is designed so that: a difference of driving voltage among the organic EL devices of the respective colors may be prevented from becoming large; and a device for any emission color may be capable of being driven at a low voltage.

While the development of a fluorescent light emitting material or phosphorescent light emitting material has been performed, Japanese Patent Application Laid-Open No. 2004-241374 describes that a delayed fluorescent material is used in an organic EL device.

A fluorescent light emitting material is theoretically hard to show an internal quantum efficiency of 100%. On the other hand, a phosphorescent light emitting material can theoretically show an internal quantum efficiency of 100%.

However, in the case of an organic EL device having an emission layer in which the phosphorescent light emitting material is incorporated as a guest material into a host material, the band gap of the host material cannot help being expanded as compared to that in the case where the emission layer has the fluorescent light emitting material that emits light of the same color as that of light emitted from the phosphorescent light emitting material.

When light of a certain color is to be emitted, the lowest excited triplet state T1 of the phosphorescent light emitting material must be at an energy level corresponding to the color. The lowest excited singlet state S1 of the phosphorescent light emitting material is higher than the T1. In addition, the T1 of the host material having the phosphorescent light emitting material is higher than the T1 of the phosphorescent light emitting material, and the S1 of the host material is higher than the T1 of the host material.

In the case of the fluorescent light emitting material that emits light of the same color as that described above, an excited state corresponding to the color is not the T1 but the S1. That is, when the fluorescent light emitting material and the phosphorescent light emitting material emit light of the same color, the S1 of the fluorescent light emitting material is lower than the S1 of the phosphorescent light emitting material. Accordingly, when the emission layer has the phosphorescent light emitting material as a guest material, the S1 of the host material cannot help being made higher than that in the case where the emission layer has the fluorescent light emitting material. As a result, the band gap of the host material cannot help being expanded.

The following procedure plays an important role in moving a carrier (an electron or a hole) from a layer adjacent to the emission layer to the emission layer: an energy barrier between the emission layer and the adjacent layer is not expanded. As the band gap of the host material expands, highest occupied molecular orbital (HOMO) or lowest unoccupied molecular orbital (LUMO) of the host material starts to differ from the HOMO or LUMO of the adjacent layer. As a result, the barrier becomes high.

In that case, the following procedure is needed: an optimum material for the adjacent layer is selected, or a novel compound is created to serve as a material for the layer. In addition, in that case, whether the extent to which the carrier is injected from an electrode is large or small must be taken into consideration. As a result, the layer constitution of an organic EL device must be designed again from scratch.

By the way, Japanese Patent Application Laid-Open No. 2004-241374 describes the delayed fluorescent material. The delayed fluorescent material showed each of a strong delayed fluorescent spectrum and a strong phosphorescent spectrum in the range of 520 nm to 750 nm, and an emission wavelength actually illustrated in the figure is formed of a peak having a maximum emission wavelength in excess of 550 nm and a peak having a maximum emission wavelength in excess of 600 nm. That is, the delayed fluorescent material is not a light emitting material that emits light of a primary color such as a green or blue color in view of its color purity.

SUMMARY OF THE INVENTION

Accordingly, the present invention provides an organic electroluminescent display apparatus, including: red organic electroluminescent devices; green organic electroluminescent devices; and blue organic electroluminescent devices, each of the electroluminescent devices serving as a pixel and having a pair of electrodes, a hole transport layer, and an emission layer, in which: the emission layer of each of the green organic electroluminescent devices has a delayed fluorescent material; each of the green organic electroluminescent devices has a microcavity between the pair of electrodes; and the hole transport layers of the green organic electroluminescent devices and the blue organic electroluminescent devices are provided so that the layers have the same thickness and are common to the devices.

According to the present invention, there can be provided an organic EL display apparatus that consumes low power because each of the green organic EL devices is an organic EL device which: uses the delayed fluorescent material; and can be a low driving voltage. Each of the green organic EL devices can emit light with a high color purity by virtue of the following effect of the microcavity in the device: the emission spectral bandwidth of light emitted from the delayed fluorescent material is narrowed. Further, in the present invention, particularly the green organic EL devices and the blue organic EL devices out of the red organic EL devices, the green organic EL devices, and the blue organic EL devices can be provided with hole transport layers having the same thickness.

Further features of the present invention will become apparent from the following description of exemplary embodiments with reference to the attached drawings.

DESCRIPTION OF THE EMBODIMENTS

Figure 1:
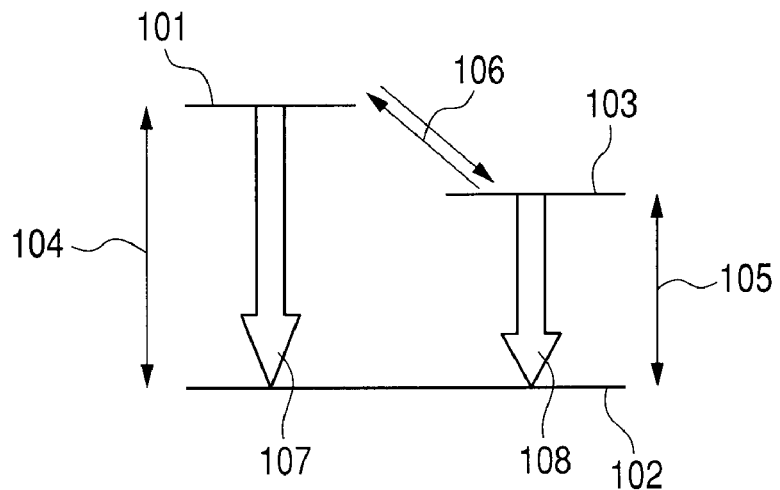
FIG. 1 is a conceptual view illustrating each emission process.

Preferred embodiments of the present invention will now be described in detail in accordance with the accompanying drawings.

An organic electroluminescent display apparatus according to the present invention includes: red organic electroluminescent devices; green organic electroluminescent devices; and blue organic electroluminescent devices, each of the electroluminescent devices serving as a pixel and having a pair of electrodes, a hole transport layer, and an emission layer, in which: the emission layer of each of the green organic electroluminescent devices has a delayed fluorescent material; each of the green organic electroluminescent devices has a microcavity between the pair of electrodes; and the hole transport layers of the green organic electroluminescent devices and the blue organic electroluminescent devices are provided so that the layers have the same thickness and are common to the devices.

In the present invention, the delayed fluorescent material is used in each green organic EL device having high emission energy. As a result, the following fact is obtained: a barrier between the HOMO's of the material and a compound for the hole transport layer is narrower than that in the case where a phosphorescent light emitting material is used. As a result, the driving voltage can be lowered, so the driving voltage can be prevented from increasing significantly even when the thickness of the emission layer is increased. In addition, the microcavity of each green organic EL device can be achieved by making the thickness of the emission layer the largest of organic compound layers interposed between the pair of electrodes. Thus, the light extraction efficiency of each green organic EL device is improved. Further, the hole transport layer of each green organic EL device can be made so as to have the same thickness as that of the hole transport layer of each blue organic EL device at the same timing as that of the latter hole transport layer. As a result, a production process for the apparatus is simplified. In addition, as a result, the hole transport layer can be provided so as to have a small thickness optimum for each blue organic EL device that emits blue light having a shorter wavelength than that of green light.

The delayed fluorescent material in the present invention is a thermal excitation-type delayed fluorescent material. Thermal excitation-type delayed fluorescence is described with reference to FIG. 1. First, reference numerals in the figure are described. Reference numeral 101 represents a lowest excited singlet state ($S_1$); 102, a ground state ($S_0$); 103, a lowest excited triplet state; 104, the energy of the $S_1$ state ($Eg^{S1}$); 105, the energy of a $T_1$ state ($Eg^{T1}$); 106, intersystem crossing; 107, delayed fluorescence; and 108, phosphorescence.

FIG. 1 is a view schematically illustrating an emission process for the delayed fluorescence. Excitons produced by carrier recombination are classified into one in the excited singlet state $S_1$ (101) and one in the excited triplet state $T_1$ (103). The exciton in the $S_1$ (101) can directly emit light. On the other hand, in a general organic compound, the exciton in the $T_1$ does not contribute to light emission because the exciton in the $T_1$ undergoes thermal deactivation. However, the delayed fluorescent material such as Compound 1 or 2 has the following emission path of the delayed fluorescence (107): the $T_1$ (103) undergoes the intersystem crossing (106) to the $S_1$ (101), and the $S_1$ (101) undergoes a transition to the ground state $S_0$ (102). Therefore, the use of the delayed fluorescent material can be expected to provide an organic EL device having extremely high internal quantum efficiency comparable to that of a phosphorescent material because the delayed fluorescent material can cause the exciton in the $T_1$ (103) which has not heretofore contributed to the light emission to emit light.

Examples of the delayed fluorescent material include a copper complex, a platinum complex, and a palladium complex. Compounds 1 and 2 as examples of the delayed fluorescent material are shown.

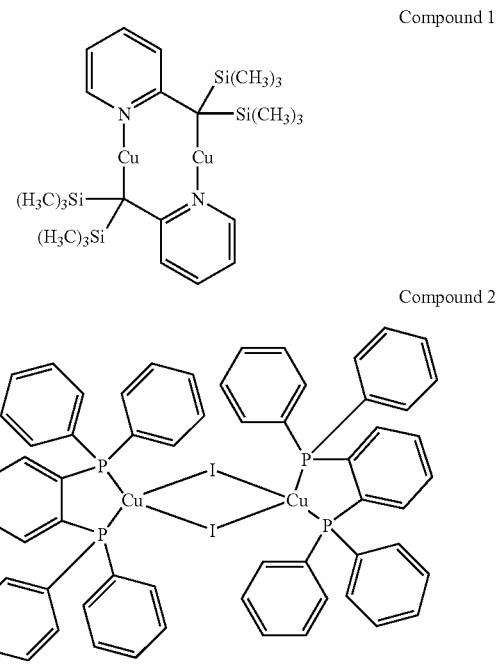

Compound 1

Compound 2

Here, an energy difference between the $S_1$ (101) and the $S_0$ (102) is represented by $Eg^{S1}$ (104), and an energy difference between the $T_1$ (103) and the $S_0$ (102) is represented by $Eg^{T1}$ (105). The $Eg^{T1}$ (105) is in a state lower in energy than the $Eg^{S1}$ (104) by an exchange integral.

Here, the $S_1$ (101) of each of the delayed fluorescent material and the phosphorescent material for the emission of light having the same energy is considered. While the $S_1$ (101) directly serves as the emission level of the delayed fluorescence (107), the emission level of phosphorescence (108) is the $T_1$ (103). Accordingly, the $S_1$ (101) of the phosphorescent material is placed at an energy level higher than the emission level of phosphorescence. Even when the delayed fluorescent material and the phosphorescent material show the same emission color, the following large difference arises: both the $S_1$ (101) and $T_1$ (103) of the delayed fluorescent material are each at an energy level lower than that of the corresponding one of the phosphorescent material.

When the $Eg^{S1}$ (104) of a light emitting material in an organic EL device is small, an energy difference between the $Eg^{S1}$ and the work function of an electrode for use in an anode or cathode, the HOMO of a hole transport layer, or the LUMO of an electron transport layer becomes small, so a barrier for the injection of a hole and a barrier for the injection of an electron become small. As a result, the driving voltage of the organic EL device reduces. Therefore, each of the $Eg^{S1}$ (104) and $Eg^{T1}$ (105) of a delayed fluorescent material is smaller than the corresponding one of a phosphorescent material at the same emission wavelength, so a barrier for the injection of a hole and a barrier for the injection of an electron become small. As a result, the driving voltage of the organic EL device reduces. Therefore, the use of the delayed fluorescent material enables the increase in the thickness of the emission layer of the organic EL device to such an extent that the driving voltage is not significantly increased. Thus, the thickness of the emission layer can be designed from a wide range.

The emission process of the delayed fluorescent material to be used in the present invention can be identified as the delayed fluorescence (107) on the basis of the emission characteristics of the material. The emission of light from a compound capable of delayed fluorescence to be used in the present invention has the following characteristics:
(1) an emission lifetime at room temperature (298 K) is at a level of $10^{-6}$ sec;
(2) an emission wavelength at room temperature (298 K) is shorter than an emission wavelength at a low temperature (77 K);
(3) the emission lifetime at room temperature (298 K) is much shorter than an emission lifetime at the low temperature (77 K); and
(4) an emission intensity increases with increasing temperature.

In the case of ordinary fluorescence and phosphorescence (108), comparison between an emission wavelength at room temperature and an emission wavelength at the low temperature shows that the wavelengths are identical to each other, or the emission wavelength at the low temperature is shorter than the other. In contrast, in the case of the delayed fluorescence (107), an emission wavelength at the low temperature is longer than an emission wavelength at room temperature. This is because of the following reason: although light emission from a singlet is observed at room temperature, light emission occurs at low temperatures from the $T_1$ (103) which is a state lower in energy than the $S_1$ (101). The term "emission wavelength" as used herein refers to the maximum emission wavelength or the wavelength at which light emission starts.

In addition, in the case of ordinary fluorescence, an emission lifetime is of the order of $10^{-9}$ sec because light emission occurs from the $S_1$ (101). In contrast, in the case of phosphorescence (108) in which the $T_1$ (103) is involved in light emission, an emission lifetime generally ranges from $10^{-6}$ sec to $10^{-3}$ sec. Similarly, in the case of the delayed fluorescence (107), an emission lifetime is of the order of $10^{-6}$ sec because the $T_1$ (103) is involved in light emission. The delayed fluorescent material used in the present invention has an emission lifetime of 0.1 microsecond or more to less than 1 millisecond in a solid state or solution state.

With regard to an emission lifetime, the emission lifetime of each of the delayed fluorescence (107) and phosphorescence (108) is at a level of about $10^{-6}$ sec; in the case of the delayed fluorescence (107), however, an emission lifetime at the low temperature is much longer than an emission lifetime at room temperature. For example, when it is assumed that non-radiation deactivation is suppressed at the low temperature, in the case of considering a phosphorescent light emitting compound having a quantum yield at room temperature of 0.1, an emission lifetime at the low temperature is at most ten times as long as an emission lifetime at room temperature. In the case of the delayed fluorescence, an emission lifetime strongly depends on temperatures because light emission occurs from different excited states at the low temperature and room temperature. Light emission occurs from the $S_1$ (101) at room temperature while light emission occurs from the $T_1$ (103) at the low temperature. Accordingly, the emission lifetime of the delayed fluorescence at the low temperature is ten or more times as long as the emission lifetime of the delayed fluorescence at room temperature; depending on the kind of the compound, it may be observed that the former is two or more orders of magnitude longer than the latter. The emission lifetime of the light emitting material used in the present invention shows the following characteristic when the material is in a solid state or solution state: an emission lifetime at the low temperature is 10 or more times, more specifically 50 or more times, or still more specifically 100 or more times as long as an emission lifetime at room temperature.

In addition, in the case of phosphorescence (108), a non-radiation deactivation rate increases with increasing temperature, so an emission intensity reduces. In contrast, in the case of the delayed fluorescence (107), an emission intensity increases with increasing temperature. This is because of the following reason: the probability that intersystem crossing (106) from the $T_1$ (103) to the $S_1$ (101) occurs increases by virtue of external temperature energy, so the $T_1$ (103) exciton undergoes intersystem crossing (106) to the $S_1$ (101) so as to be capable of easily emitting light.

Therefore, a delayed fluorescent material having a small $Eg^{S1}$ (104) tends to show high efficiency. However, the small $Eg^{S1}$ (104) is achieved through the following procedure: the $S_1$ (101) and the $T_1$ (103) are each in a charge transferable state, so an exchange integral becomes extremely small. Accordingly, the delayed fluorescence (107) described herein is often light emission mainly from an excited state having charge-transferring property. In general, an emission spectrum from a charge transfer state has the following characteristic: the spectrum tends to be wide. Accordingly, when the emission of light from an organic EL device containing a delayed fluorescent material is adopted for a display application, a unit capable of adjusting, for example, an emission spectral width or an emission peak is preferably provided together.

The organic EL devices according to the present invention each have a pair of electrodes formed of an anode and a cathode, an emission layer interposed between the electrodes, and a hole transport layer provided on an anode side so as to contact the emission layer. Each of the devices may have a hole injection layer, an electron blocking layer, a hole blocking layer, an electron transport layer, or an electron injection layer between the pair of electrodes in addition to the above layers, and the layers have only to be provided as appropriate.

Figure 2:
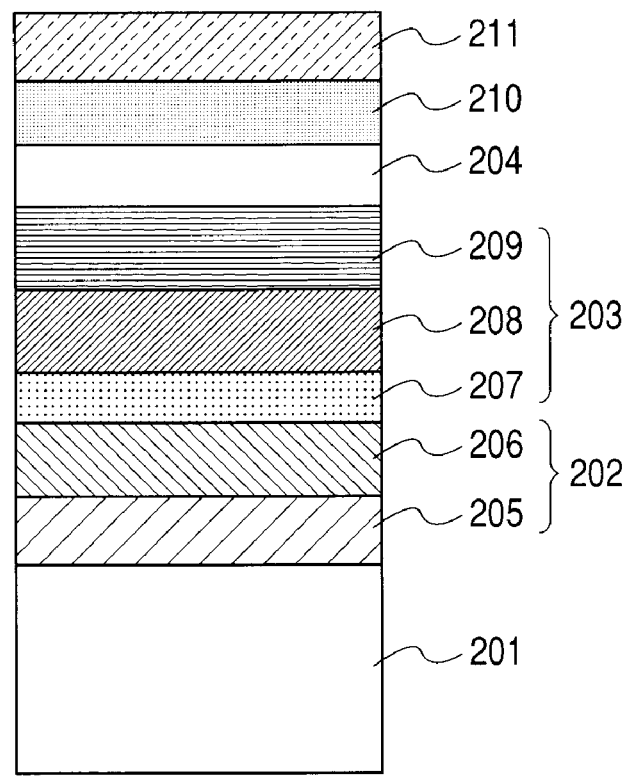
FIG. 2 is a schematic view illustrating the section of an organic EL device of the present invention.

FIG. 2 illustrates an example of the constitution of an organic EL device in this embodiment. In the figure, the organic EL device is formed of an upper electrode, a lower electrode, and organic functional layer. In FIG. 2, reference numeral 201 represents a substrate; 202, an anode (reflective electrode); 203, an organic functional layer; 204, a cathode (reflective electrode); 205, a reflective layer; 206, a transparent conductive film; 207, a hole transport layer; 208, an emission layer; 209, an electron transport layer; 210, a protective layer; and 211, a sealing glass.

FIG. 2 illustrates the following constitution as an example: the lower electrode is the reflective electrode 202 as the anode, and the upper electrode is the semitransparent electrode 204 as the cathode.

In the formation of a microcavity, both the interfaces of the upper and lower electrodes on an organic layer side are each a reflective surface. The combination of the electrodes of a light emitting device is a combination of a reflective electrode and a semitransparent electrode because light is extracted from one of the electrodes; which one of the electrodes is placed on an upper side or lower side may be arbitrarily determined depending on a light extraction surface and the constitution of the device. For example, this embodiment shows a top emission device in which emitted light is extracted from the semitransparent electrode on the side opposite to the substrate 201; the present invention is also applicable to a bottom emission type device.

Here, the reflective electrode 202 is formed of the reflective layer 205 and the transparent conductive film 206.

The reflective layer 205 satisfies the following condition: a reflectivity at an interface between the layer and the transparent conductive film 206 is at least 50%, or preferably 80% or more. Although a material for the layer is not particularly limited, for example, a metal such as silver (Ag), aluminum (Al), or chromium (Cr), or an alloy of any one of the metals is used. In addition, gold (Au), platinum (Pt), tungsten (W), or the like having a high work function is an effective material for an electrode that brings together high hole-injecting property and a high reflectivity.

An oxide conductive film, or specifically, for example, a compound film (ITO) formed of indium oxide and tin oxide or a compound film (IZO) formed of indium oxide and zinc oxide can be used as the transparent conductive film 206. The transparent conductive film can be introduced as required. The case where the transparent conductive film is introduced is, for example, the case where a barrier for the injection of a carrier from the reflective layer to the organic functional layer is reduced, the case where an optical path length in the device is adjusted, or the case where the reflective layer is formed of an insulating member such as a dielectric multilayer film.

The term "transparent" as used herein refers to a state where the transparent conductive film 206 has a transmittance of 80% or more to 100% or less; to be more specific, the film has an extinction coefficient K of desirably 0.05 or less, or preferably 0.01 or less from the viewpoint of the suppression of the attenuation of light emitted from the emission layer caused by multiple reflection.

The semitransparent reflective electrode 204 is formed of a single element or alloy of a metal material. The metal material has a large extinction coefficient K, so the quantity of transmitted light reduces owing to light absorption upon transmission of light through the electrode. The light absorption must be suppressed in order that light may be efficiently extracted from the semitransparent reflective electrode. Accordingly, a material having a small real-part refractive index is preferably selected. A metal material capable of achieving the object is, for example, silver, aluminum, magnesium, calcium, sodium, or gold.

In FIG. 2, the organic functional layer 203 is formed of three layers such as the hole transport layer 207, the emission layer 208, and the electron transport layer 209, but only the emission layer suffices; alternatively, the organic functional layer may be formed of multiple layers such as two or four layers.

Although the emission layer 208 may be formed only of, for example, a delayed fluorescent light emitting material, the delayed fluorescent material is preferably used as a light emitting dopant from the viewpoints of the emission efficiency and driving lifetime of the device. The concentration at which the layer is doped with the light emitting dopant, which is not particularly specified, is preferably 5 to 50 wt %, or more preferably 10 to 30 wt %. In this case, the term "emission layer" refers to a layer containing a light emitting dopant.

Although the hole transport layer 207 and the electron transport layer 209 each have not only a transporting function but also a function as a charge injection layer from an electrode, a separate injection layer or transport layer may be newly provided. Alternatively, a layer having, for example, a charge blocking function or a function of preventing the diffusion of excitons may be newly provided as a layer adjacent to the emission layer.

In such a device, a microcavity is formed between both reflective surfaces defined as follows: an interface between the reflective electrode 202 and the hole transport layer 207 on the substrate 201 or an interface between the reflective layer 205 and the transparent conductive film 206 on the substrate, and an interface between the semitransparent electrode 204 and the electron injection layer 209 on the substrate are defined as the reflective surfaces. The optical path length of the organic functional layer between the upper and lower electrodes is represented by L, a resonant wavelength is represented by λ, the angle at which light emitted from the device is visually observed is represented by θ (an angle in the case where one visually observes the light at a diametrically opposite position to the device is defined as 0°), and the order of interference is represented by m. In addition, in the case where the sum of phase shifts upon reflection of the emitted light at the respective electrodes is represented by φ (rad), enhancement by virtue of a resonance effect can be utilized when the respective parameters satisfy the relationship represented by <Formula 1>:

$$\frac{2L\cos\theta}{\lambda} + \frac{\phi}{2\pi} = m \ (m = 1, 2, 3 \ldots) \qquad <\text{Formula 1}>$$

where the optical path length L is the total sum (=n1d1+ n2d2+ . . . ) of the optical thicknesses (=refractive index (n)×thickness (d)) of the organic functional layer between the upper and lower electrodes. It should be noted that, when the emitted light actually reflects at the respective electrodes, the sum φ of the phase shifts changes depending on a combination of electrode materials and organic materials of which the reflective interfaces are formed.

The peak wavelength of each emission color is, for example, as follows: 600 to 680 nm for a red color, 500 nm to 560 nm for a green color, and 430 to 490 nm for a blue color. Therefore, in the case of microcavities having the same order of interference, the R, G, and B colors can be arranged in order of decreasing emission wavelength as follows: R>G>B. Accordingly, the following order is valid for an optical path length determined by the stacked layer thickness of a device: R>G>B.

When the length between the reflective surfaces is excessively long, the enhancement by virtue of resonance does not occur, though whether the enhancement occurs depends on a set value for the m. Accordingly, the length between the reflective surfaces must be a coherence length. To be specific, the length between both the reflective surfaces is preferably 5 μm or less, or more preferably 1 μm or less.

When this constitution is to be implemented, the m in Formula 1 is preferably 1 or more to less than 7, or more preferably 1 or 2. This is because of the following reason: when the m is 7 or more, the thickness of each organic film is about 1 μm, so an effect of the increased voltage at which the device is driven starts to emerge.

A device provided with a microcavity is of such a constitution that light corresponding to the resonant wavelength of the microcavity is enhanced and extracted to the outside. In general, the peak wavelength of an internal emission spectrum and the resonant wavelength (wavelength at which the light is enhanced to the largest extent by resonance) are preferably caused to coincide with each other in order that a narrow spectrum having a high peak intensity may be obtained.

Because the emission spectra of delayed fluorescent materials often have wide half widths, the internal emission peak wavelength and resonant wavelength of the device are expected to deviate from each other. In this case, with a view to improving chromaticity, the resonant wavelength is set so that the chromaticity may be improved for the internal emission peak wavelength. For example, the resonant wavelength may be set so as to be longer than the internal emission peak wavelength.

Thus, a device showing high efficiency and excellent chromaticity can be realized.

As described above, a delayed fluorescent material has a smaller band gap than a phosphorescent material at the same emission wavelength. Accordingly, there is no need to increase the band gap of, for example, a host material or any other auxiliary dopant material of which the emission layer 208 is formed as compared to that in the case of a constitution using a phosphorescent material having the same emission wavelength as that of the delayed fluorescent material. Therefore, a hole or electron is smoothly injected into the emission layer using the delayed fluorescent material. Accordingly, the use of the delayed fluorescent material in the emission layer contributes to a reduction in voltage at which the device is driven. In the case of an organic EL device formed of an emission layer using a delayed fluorescent material, an increase in driving voltage is small even when the thickness of the emission layer is increased.

Increasing the thickness of the emission layer is one available approach to satisfying the condition represented by Formula 1 as a resonance condition. A large amount of the delayed fluorescent material as a light emitting dopant is preferably incorporated in order that the voltage at which the device is driven may be reduced, or the thickness of the emission layer may be increased. The concentration at which the emission layer is doped with the light emitting dopant is preferably 5 to 50 wt %, or more preferably 10 to 30 wt %.

Figure 3:
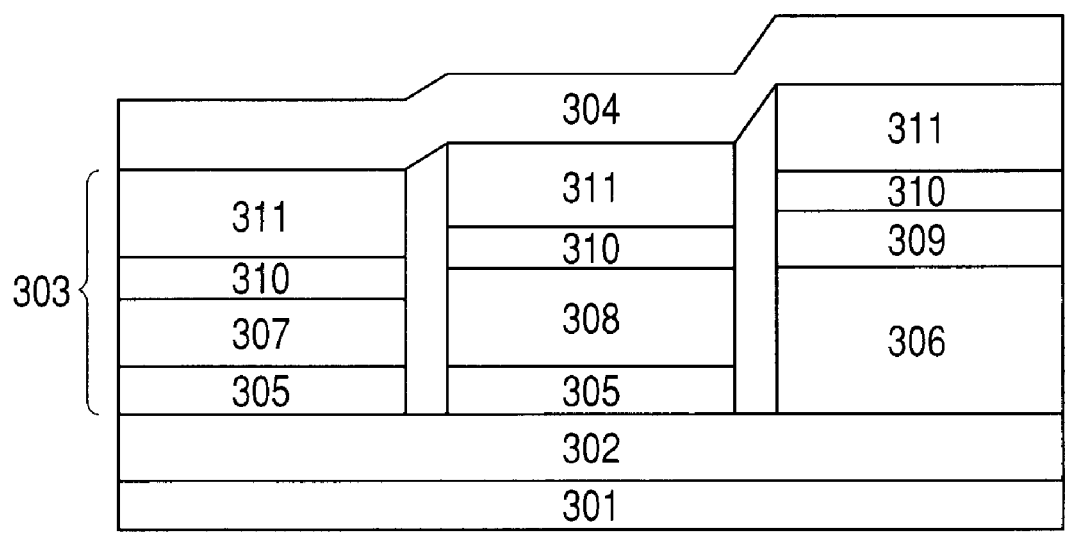
FIG. 3 is a schematic view illustrating the section of an organic EL display apparatus of the present invention.

Next, the display apparatus of the present invention is described with reference to FIG. 3.

The devices of the display apparatus are formed of: a reflective layer 301; a transparent electrode layer 302; organic functional layer 303; a semitransparent reflective electrode 304 as a cathode; hole transport layers 305 and 306; a blue emission layer 307; a green emission layer 308; a red emission layer 309; and electron transport layers 310 and 311. In this embodiment, a delayed fluorescent material is a light emitting dopant for the green emission layer. A delayed fluorescent material for any other emission color is also present, and an emission layer using a delayed fluorescent material is not particularly limited to the green emission layer.

In a device for each color, the thicknesses of, for example, the transparent conductive layer 302, the hole transport layers 305 and 306, and the electron transport layers 310 and 311 are adjusted so that the resonance condition for the R, G, or B color may be satisfied.

In general, in the case of a display panel mounted with R, G, and B organic EL devices, the following procedure leads to the complication of a production process for the display apparatus because evaporation with a mask is to be performed in accordance with a pixel for each of the R, G, and B colors: the optical thicknesses of, for example, the transparent conductive layer 302, the hole transport layers 305 and 306, and the electron transport layers 310 and 311 for each color are changed.

However, in the present invention, when the thickness of the emission layer of a device containing the delayed fluorescent material is increased as compared to any other organic layer, thicknesses can be increased so that the microcavity condition may be satisfied. An optical thickness to be adjusted with the thickness of the hole transport layer or the thickness of the electron transport layer is offset by increasing the thickness of the emission layer 308 containing the delayed fluorescent material. As a result, the hole transport layers 305 of at least B and G pixels can be provided with a common thickness. This embodiment adopts such a constitution that the thickness of the emission layer of the G pixel is the largest in which the thickness of the hole transport layer 305 of the G pixel is common to that of the B pixel. The foregoing means that the G pixel and an R pixel can be similarly provided with a common hole transport layer.

Not only the microcavity condition but also optical interference along a path toward the reflective electrode must be taken into consideration for the blue pixel in which avoiding a reduction in light extraction efficiency is necessary. Accordingly, when the common hole transport layer 305 is provided for the device structures of the blue and green pixels, optical interference between the emission position and reflective electrode of the blue pixel is preferably adapted for an optimum condition. Thus, providing a common hole transport layer enables the green pixel to satisfy the microcavity condition through the adjustment of the thickness of the emission layer without a reduction in performance of the blue pixel.

The organic EL display apparatus according to the present invention has only to satisfy the following conditions: multiple red organic EL devices, multiple green organic EL devices, and multiple blue organic EL devices are provided in the plane of a substrate, and each of the devices forms a pixel.

The organic EL devices for the respective colors may be connected through a signal line for each row, or may be connected through an information line for each column.

The organic EL devices for the respective colors may each be connected to a TFT for controlling the luminance of the device.

Each of the red, green, and blue organic EL devices in the organic EL display apparatus according to the present invention may be of the so-called bottom emission type in which light is extracted to the outside through its substrate, or may be of the so-called top emission type in which light is extracted to the outside not via the substrate.

The organic EL display apparatus according to the present invention is applicable to any embodiment with no limitation as long as the display apparatus is used in, for example, a display apparatus for a television set or a personal computer, or an instrument having a unit for displaying an image. For example, a portable display apparatus on which the display apparatus of the present invention is mounted is permitted. Alternatively, the display apparatus of the present invention can be used in the display unit of an electronic imaging device such as a digital camera or of a portable phone.

(Green Organic EL Device Example 1)

In this example, a green organic EL device having the constitution illustrated in FIG. 2 was produced as described below.

A silver alloy (AgCuNd) was patterned into a film having a thickness of 100 nm to serve as a reflective electrode on a glass substrate as a support member by a sputtering method. Further, IZO was formed and patterned into a film having a thickness of 10 nm to serve as a transparent electrode by a sputtering method. Thus, an anode was formed.

Next, organic functional layer was provided by the following procedure.

PF01 (Compound 3) was formed into a film having a thickness of 15 nm to serve as a hole transport layer by vacuum evaporation. A degree of vacuum during the evaporation was $5 \times 10^{-5}$ Pa.

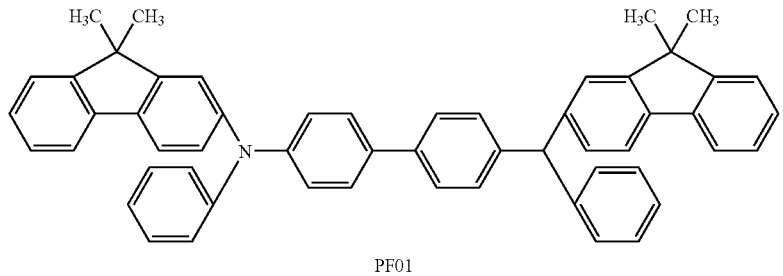

PF01

Next, CBP (Compound 4) used as a host material and Compound 1 used as a light emitting dopant material were formed into a film having a thickness of 42 nm to serve as an emission layer by co-evaporation (at a weight ratio of 9:1). A degree of vacuum during the evaporation was $5 \times 10^{-5}$ Pa.

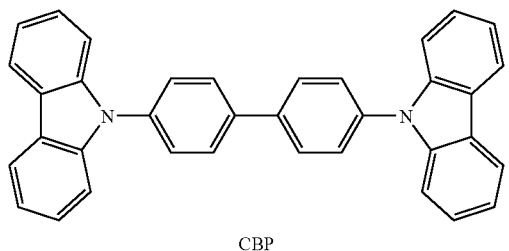

CBP

Bphen (Compound 5) was formed into a film having a thickness of 10 nm to serve as an electron transport layer by vacuum evaporation. A degree of vacuum during the evaporation was $5 \times 10^{-5}$ Pa.

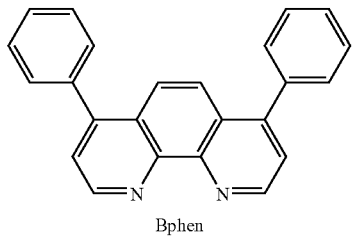

Bphen

Further, Bphen and $Cs_2CO_3$ were formed into a film having a thickness of 14 nm to serve as an electron transport layer by co-evaporation (at a weight ratio of 9:1). A degree of vacuum during the evaporation was $5 \times 10^{-5}$ Pa.

Silver (Ag) was formed into a film having a thickness of 15 nm to serve as a cathode by vacuum evaporation. A degree of vacuum during the evaporation was $8 \times 10^{-5}$ Pa.

The substrate onto which the films including the cathode had been formed was transferred to a sputtering apparatus. Then, silicon oxynitride was formed into a film having a thickness of 1,500 nm to serve as a protective layer. Thus, the organic EL device was obtained.

The organic EL device was evaluated by the following methods. A DC constant-current power source (manufactured by ADC CORPORATION, trade name: R6243) was used as a driving power source. A luminance meter (manufactured by TOPCON CORPORATION, trade name: BM-7 FAST) was used in luminance measurement. An instantaneous multiple photometric system (MCPD-7000 manufactured by Otsuka Electronics Co., Ltd.) was used in CIE chromaticity measurement. The organic EL device produced in this example was evaluated for its values of CIE chromaticity, driving voltage, and emission efficiency at a luminance of 100 $cd/m^2$.

When the organic EL device produced in this example was caused to emit light at a luminance of 100 $cd/m^2$, the device emitted green light having chromaticity coordinates (x, y) according to the CIE colorimetric system of (0.22, 0.70). At that time, the driving voltage was 4 V, and the device showed an emission efficiency of 22 cd/A. The organic EL device obtained in this example had the following characteristics: the device obtained in this example was driven at a lower voltage than the voltage at which a device obtained in Comparative Example 1 was driven, and the device obtained in this example was better in chromaticity than the device obtained in Comparative Example 1 was.

Comparative Example 1

A device was produced in the same manner as in the green organic EL device example 1; provided that a phosphorescent material $Ir(ppy)_3$ (Compound 6) shown below was used as a light emitting dopant material upon formation of the emission layer, and an IZO electrode as a transparent conductive film was formed by a sputtering method and used as a cathode.

Compound 6

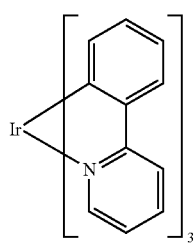

When the organic EL device produced in this example was caused to emit light at a luminance of 100 $cd/m^2$, the device emitted green light having chromaticity coordinates (x, y) according to the CIE colorimetric system of (0.33, 0.67). At that time, the driving voltage was 8 V, and the device showed an emission efficiency of 16 cd/A.

(Green Organic EL Device Example 2)

A silver alloy (AgCuNd) was patterned into a film having a thickness of 100 nm to serve as a reflective electrode on a glass substrate as a support member by a sputtering method. Further, ITO was patterned into a film having a thickness of 77 nm to serve as a transparent electrode by a sputtering method. Thus, an anode was formed.

Next, an organic functional layer was provided by the following procedure.

PF01 was formed into a film having a thickness of nm to serve as a hole transport layer by vacuum evaporation. A degree of vacuum during the evaporation was $5 \times 10^{-5}$ Pa.

Next, CBP (Compound 4) used as a host material and Compound 1 used as a light emitting dopant material were formed into a film having a thickness of 105 nm to serve as an emission layer by co-evaporation (at a weight ratio of 4:1). A degree of vacuum during the evaporation was $5 \times 10^{-5}$ Pa.

Compound 7 was formed into a film having a thickness of 20 nm to serve as a hole transport layer by vacuum evaporation. A degree of vacuum during the evaporation was $5 \times 10^{-5}$ Pa.

Compound 7

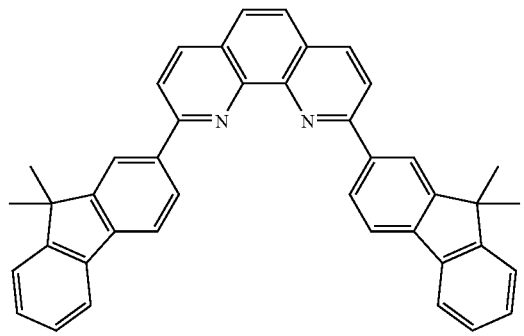

Further, Compound 7 and $Cs_2CO_3$ were formed into a film having a thickness of 60 nm to serve as an electron transport layer by co-evaporation (at a weight ratio of 9:1). A degree of vacuum during the evaporation was $5 \times 10^{-5}$ Pa.

Silver (Ag) was formed into a film having a thickness of 15 nm to serve as a cathode by vacuum evaporation. A degree of vacuum during the evaporation was $1 \times 10^{-4}$ Pa.

The substrate onto which the films including the cathode had been formed was transferred to a sputtering apparatus. Then, silicon oxynitride was formed into a film having a thickness of 1,500 nm to serve as a protective layer. Thus, the organic EL device was obtained.

When the organic EL device produced in this example was caused to emit light at a luminance of 100 cd/m², the device emitted green light having chromaticity coordinates (x, y) according to the CIE colorimetric system of (0.22, 0.70). At that time, the driving voltage was 4.5 V, and the device showed an emission efficiency of 20 cd/A. The organic EL device obtained in this example had the following characteristics: the device obtained in this example was driven at a lower voltage than the voltage at which a device obtained in Comparative Example 2 was driven.

Comparative Example 2

A device was produced in the same manner as the green organic EL device example 2; provided that a phosphorescent material $Ir(ppy)_3$ (Compound 6) shown below was used as a light emitting dopant material, and a transparent IZO electrode was formed by a sputtering method and used as a cathode instead of the silver (Ag) electrode.

Compound 6

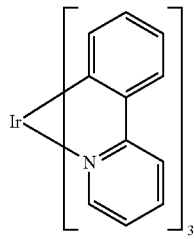

When the organic EL device produced in this example was caused to emit light at a luminance of 100 cd/m², the device emitted green light having chromaticity coordinates (x, y) according to the CIE colorimetric system of (0.33, 0.63). At that time, the driving voltage was 10 V, and the device showed an emission efficiency of 10 cd/A.

(Production Example of Organic EL Display Apparatus)

An organic EL display apparatus formed of three color organic EL devices, i.e., red (R), green (G), and blue (B) organic EL devices was produced by the following method. The display apparatus was produced so as to satisfy the following conditions: the panel size of a panel portion in which the organic EL devices were placed as pixels was 3 inches in width across corners; the number of pixels was of a QVGA type in which 240 pixels were arrayed in a longitudinal direction and 320 pixels were arrayed in a horizontal direction; and an aperture ratio of the pixels for each color, i.e., a ratio of the total area of the organic EL devices for each color to the area of the panel portion was 30%.

First, a TFT driver circuit formed of low-temperature polysilicon was formed on a glass substrate as a support member, and a pranalization film formed of an acrylic resin was formed on the circuit. A silver alloy (AgCuNd) was patterned into a reflective electrode having a thickness of 100 nm on the film by a sputtering method. Further, ITO as a transport electrode was formed into a film having a thickness of 77 nm and patterned by a sputtering method, to thereby form an anode. Further, a device isolation film was formed by using an acrylic resin. Thus, an anode side transparent electrode substrate was produced. The substrate was subjected to ultrasonic cleaning with isopropyl alcohol and boil washing, and was then dried. After that, the substrate was subjected to UV/ozone cleaning, and then organic compounds and a cathode material were formed into films by vacuum evaporation.

Next, an organic functional layer was provided by the following procedure.

PF01 was formed into a film to serve as a hole transport layer by vacuum evaporation so that the hole transport layer might function as a common layer having a thickness of 35 nm for B and G pixel portions and a thickness of 170 nm for each red pixel. A degree of vacuum during the evaporation was $5 \times 10^{-5}$ Pa. At that time, the formation of the hole transport layer for each B pixel portion and the formation of the hole transport layer for each G pixel portion were simultaneously performed in order that a process for the production of the apparatus might be simplified. It should be noted that, when the B and G pixel portions were adjacent to each other, the hole transport layer was formed astride the pixels, specifically, even on a device isolation film.

In this example, the hole transport layer provided in each R pixel portion is thicker than that in any other pixel portion. Alternatively, for example, the following procedure may be adopted: a material of which the hole transport layer is formed is formed into a film having a thickness of 35 nm on the entire region of the panel, that is, astride the pixels, and then the material of which the hole transport layer is formed is formed into a film having a thickness of 135 nm only on each R pixel portion so that a hole transport layer having a thickness of 170 nm may be eventually provided for each R pixel portion.

CBP used as a host light emitting material and a blue fluorescent material (Compound 8) shown below used as a light emitting dopant material were formed into a film having a thickness of 45 nm to serve as a blue emission layer by co-evaporation (at a weight ratio of 9:1). A degree of vacuum during the evaporation was $5×10^{-5}$ Pa.

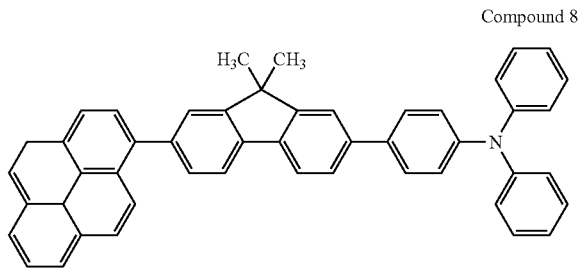

Compound 8

CBP as a host material and Compound 1 as a light emitting dopant material were formed into a film having a thickness of 105 nm to serve as a green emission layer by co-evaporation (at a weight ratio of 4:1). A degree of vacuum during the evaporation was $5×10^{-5}$ Pa.

CBP used as a host material and a red phosphorescent material (Compound 9) shown below used as a light emitting dopant material were formed into a film having a thickness of 30 nm to serve as a red emission layer by co-evaporation (at a weight ratio of 9:1). A degree of vacuum during the evaporation was $5×10^{-5}$ Pa.

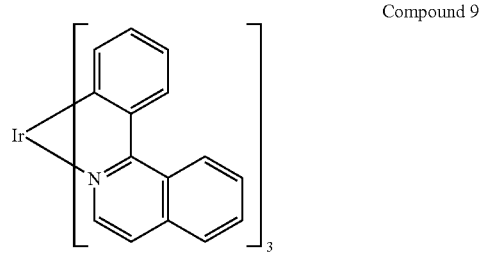

Compound 9

Upon film formation, materials were separately deposited from the vapor onto the same substrate with a mask corresponding to an emission pattern. Thus, organic EL devices having the following characteristic were obtained: R, G, and B pixels having the constitution illustrated in FIG. 3 were arrayed in a matrix fashion.

Compound 7 was formed into a film having a thickness of 20 nm to serve as a common electron transport layer on those emission layers by vacuum evaporation so that the layer might cover the entire panel region where the pixel portions were placed. Further, Compound 6 and $Cs_2CO_3$ were formed into a film having a thickness of 60 nm by co-evaporation (at a weight ratio of 9:1). A degree of vacuum during the evaporation was $5×10^{-5}$ Pa.

Silver (Ag) was formed into a film having a thickness of 15 nm to serve as a cathode.

Further, silicon oxynitride was formed into a film having a thickness of 700 nm to serve as a protective film. Thus, the organic EL display apparatus was obtained.

A power consumption when a white color was displayed on the organic EL display apparatus at a luminance of 200 $cd/m^2$ was 400 mW. The chromaticity coordinates (x, y) in a CIE colorimetric system of each of the R, G, and B light emitting pixels were as follows: the coordinates of each B pixel were (0.15, 0.08), the coordinates of each G pixel were (0.22, 0.67), and the coordinates of each R pixel were (0.67, 0.31). An NTSC ratio among the coordinates was 93%, so a display apparatus having an excellent color reproduction range was obtained.

In this example, evaporation with a mask was needed for the hole transport layers and the emission layers, and other layers were common layers. Accordingly, the number of times of the evaporation with a mask needed for the formation of the organic functional layer was five. In this example, an organic EL display apparatus having the following characteristics was obtained: the apparatus had a wider color reproduction range than that of an apparatus obtained in Comparative Example 3, consumed lower power than the apparatus obtained in Comparative Example 3 did, and was obtained by performing the evaporation with a mask a smaller number of times than in Comparative Example 4.

Comparative Example 3

An organic EL display apparatus was produced in the same manner as in the above production example of an organic EL display apparatus; provided that Compound 6 was used as a light emitting dopant material for the green emission layer, and a transparent IZO electrode was formed by a sputtering method and used as a cathode instead of the silver (Ag) electrode.

A power consumption when a white color was displayed on the organic EL display apparatus at a luminance of 200 $cd/m^2$ was 600 mW. The chromaticity coordinates (x, y) in a CIE colorimetric system of each of the R, G, and B light emitting pixels were as follows: the coordinates of each B pixel were (0.15, 0.11), the coordinates of each G pixel were (0.27, 0.65), and the coordinates of each R pixel were (0.67, 0.31). An NTSC ratio among the coordinates was 80.7%.

In this example, evaporation with a mask was needed for the hole transport layers and the emission layers, and other layers were common layers. Accordingly, the number of times of the evaporation with a mask needed for the formation of the organic functional layer was five.

Comparative Example 4

A display apparatus in which the organic functional layer in the above production example of an organic EL display apparatus were changed as described below was produced.

PF01 was formed into a hole transport layer by vacuum evaporation with a mask so that the following conditions might be satisfied: the thickness of the hole transport layer on each B pixel was 35 nm, the thickness of the hole transport layer on each G pixel was 95 nm, and the thickness of the hole transport layer on each R pixel was 170 nm. A degree of vacuum during the evaporation was $5×10^{-5}$ Pa.

CBP used as a host light emitting material and a blue fluorescent material (Compound 8) shown above used as a light emitting dopant material were formed into a film having a thickness of 35 nm to serve as a blue emission layer by co-evaporation (at a weight ratio of 9:1). A degree of vacuum during the evaporation was $5×10^{-5}$ Pa. CBP as a host material and Compound 1 as a light emitting dopant material were formed into a film having a thickness of 45 nm to serve as a green emission layer by co-evaporation (at a weight ratio of 9:1). A degree of vacuum during the evaporation was $5\times10^{-5}$ Pa. CBP used as a host material and a red phosphorescent material (Compound 9) shown above used as a light emitting dopant material were formed into a film having a thickness of 30 nm to serve as a red emission layer by co-evaporation (at a weight ratio of 9:1). A degree of vacuum during the evaporation was $5\times10^{-5}$ Pa.

A power consumption when a white color was displayed on the organic EL display apparatus at a luminance of 200 cd/m$^2$ was 400 mW. The chromaticity coordinates (x, y) in a CIE colorimetric system of each of the R, G, and B light emitting pixels were as follows: the coordinates of each B pixel were (0.15, 0.08), the coordinates of each G pixel were (0.22, 0.67), and the coordinates of each R pixel were (0.67, 0.31). An NTSC ratio among the coordinates was 93%, so a display apparatus having an excellent color reproduction range was obtained.

In this comparative example, evaporation with a mask was needed for the hole transport layers and the emission layers, and other layers were common layers. However, one extra time of evaporation with a mask was needed for the hole transport layers compared to Comparative Example 3. Accordingly, the number of times of the evaporation with a mask needed for the formation of the organic functional layer was six.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2008-264427, filed Oct. 10, 2008, and No. 2009-222633, filed Sep. 28, 2009, which are hereby incorporated by reference herein in their entirety.

What is claimed is:

1. An organic electroluminescent display apparatus, comprising:
   red organic electroluminescent devices;
   green organic electroluminescent devices; and
   blue organic electroluminescent devices,
   each of the electroluminescent devices serving as a pixel and having a pair of electrodes, a hole transport layer, and an emission layer,
   wherein:
   the emission layer of each of the green organic electroluminescent devices has a delayed fluorescent material;
   each of the green organic electroluminescent devices has a microcavity between the pair of electrodes; and
   the hole transport layers of the green organic electroluminescent devices and the blue organic electroluminescent devices are provided so that the layers have the same thickness and are common to the devices.

2. The organic electroluminescent display apparatus according to claim 1, wherein a layer having a largest thickness out of the layers interposed between the pair of electrodes of each of the green organic electroluminescent devices comprises the emission layer.

* * * * *